United States Patent
Mase et al.

(10) Patent No.: US 9,293,499 B2
(45) Date of Patent: Mar. 22, 2016

(54) SEMICONDUCTOR LIGHT DETECTING ELEMENT HAVING SILICON SUBSTRATE AND CONDUCTOR

(75) Inventors: Mitsuhito Mase, Hamamatsu (JP);
Akira Sakamoto, Hamamatsu (JP);
Takashi Suzuki, Hamamatsu (JP);
Tomohiro Yamazaki, Hamamatsu (JP);
Yoshimaro Fujii, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/634,249

(22) PCT Filed: Feb. 22, 2011

(86) PCT No.: PCT/JP2011/053835
§ 371 (c)(1),
(2), (4) Date: Sep. 12, 2012

(87) PCT Pub. No.: WO2011/129149
PCT Pub. Date: Oct. 20, 2011

(65) Prior Publication Data
US 2013/0001651 A1    Jan. 3, 2013

(30) Foreign Application Priority Data
Apr. 14, 2010 (JP) .................. 2010-093180

(51) Int. Cl.
*H01L 27/146* (2006.01)
*H01L 31/0236* (2006.01)

(52) U.S. Cl.
CPC ........ *H01L 27/1464* (2013.01); *H01L 27/1463* (2013.01); *H01L 27/14643* (2013.01); *H01L 31/0236* (2013.01)

(58) Field of Classification Search
CPC ............ H01L 31/0236; H01L 27/1446; H01L 31/035281; H01L 31/1804; H01L 27/1463; H01L 27/1464; H01L 27/14643
USPC .................................. 257/225, 431, E31.055
See application file for complete search history.

(56) References Cited

U.S. PATENT DOCUMENTS

| 4,277,793 A | 7/1981 | Webb |
| 2004/0241930 A1* | 12/2004 | Okabe ................... H01L 21/28 438/212 |
| 2007/0138590 A1 | 6/2007 | Wells et al. |
| 2007/0211493 A1* | 9/2007 | Fang et al. .................. 362/616 |

(Continued)

FOREIGN PATENT DOCUMENTS

| CN | 1860611 | 11/2006 |
| EP | 0 724 299 | 7/1996 |
| EP | 2 040 308 | 3/2009 |

(Continued)

*Primary Examiner* — Duy T Nguyen
(74) *Attorney, Agent, or Firm* — Drinker Biddle & Reath LLP

(57) ABSTRACT

A semiconductor light detecting element is provided with a silicon substrate having a semiconductor layer, and an epitaxial semiconductor layer grown on the semiconductor layer and having a lower impurity concentration than the semiconductor layer; and conductors provided on a surface of the epitaxial semiconductor layer. A photosensitive region is formed in the epitaxial semiconductor layer. Irregular asperity is formed at least in a surface opposed to the photosensitive region in the semiconductor layer. The irregular asperity is optically exposed.

6 Claims, 15 Drawing Sheets

(56) References Cited

U.S. PATENT DOCUMENTS

2009/0230498 A1* 9/2009 Iwai .................. H01L 27/1443
                                                      257/461
2010/0066878 A1* 3/2010 Mabuchi ....................... 348/296

FOREIGN PATENT DOCUMENTS

| EP | 2 166 373 | 3/2010 |
| EP | 2 403 013 | 1/2012 |
| JP | S60-158679 | 8/1985 |
| JP | 4-242980 | 8/1992 |
| JP | 05243600 | * 9/1993 |
| JP | 6-244444 | 9/1994 |
| JP | 8-242015 | 9/1996 |
| JP | H9-018048 | 1/1997 |
| JP | 2008-515196 | 5/2008 |
| JP | 2009-014460 | 1/2009 |
| JP | 2009047661 | * 3/2009 |
| JP | 2009-177145 | 8/2009 |
| JP | 2010-067920 | 3/2010 |
| WO | 2008/004547 | 1/2008 |
| WO | WO20081432428 | * 11/2008 |
| WO | 2009/025365 | 2/2009 |
| WO | 2010/098225 | 9/2010 |

* cited by examiner

SEMICONDUCTOR LIGHT DETECTING ELEMENT HAVING SILICON SUBSTRATE AND CONDUCTOR

TECHNICAL FIELD

The present invention relates to a semiconductor light detecting element.

BACKGROUND ART

A known semiconductor light detecting element is one provided with a silicon substrate having: a semiconductor layer having a first impurity concentration; and an epitaxial semiconductor layer grown on the semiconductor layer and having a second impurity concentration lower than the first impurity concentration (e.g., cf. "Prior Art" described in Patent Literature 1).

CITATION LIST

Patent Literature

Patent Literature 1: Japanese Patent Application Laid-open No. H04-242980

SUMMARY OF INVENTION

Technical Problem

In the semiconductor light detecting element using the silicon substrate, generally, it is possible to enhance the spectral sensitivity characteristic on the long wavelength side, by setting the thickness of the silicon substrate to a large value. However, even if the thickness of the silicon substrate was set at a sufficiently large value (e.g., about 1.5 mm), it was difficult to obtain a satisfactory spectral sensitivity characteristic in the near-infrared wavelength band around 1100 nm. The large thickness of the silicon substrate will lead to increase in the size of the semiconductor light detecting element per se, and can also raise a new problem of increase in dark current. The large thickness of the silicon substrate can also cause a problem of decrease in response speed.

An object of the present invention is to provide a semiconductor light detecting element using a silicon substrate, as one having a practically sufficient sensitivity characteristic in the wavelength band including the near-infrared band.

Solution to Problem

The present invention provides a semiconductor light detecting element comprising: a silicon substrate having a semiconductor layer having a first impurity concentration, and an epitaxial semiconductor layer grown on the semiconductor layer and having a second impurity concentration lower than the first impurity concentration; and a conductor provided on a surface of the epitaxial semiconductor layer, wherein a photosensitive region is formed in the epitaxial semiconductor layer, wherein irregular asperity is formed at least in a surface opposed to the photosensitive region in the semiconductor layer, and wherein the irregular asperity is optically exposed.

In the semiconductor light detecting element according to the present invention, the irregular asperity is formed at least in the surface opposed to the photosensitive region in the semiconductor layer. Light incident into the semiconductor light detecting element is reflected, scattered, or diffused on the surface with the irregular asperity therein to travel through a long distance in the silicon substrate. This allows the light incident into the semiconductor light detecting element to be absorbed mostly in the silicon substrate to generate charge, without being transmitted by the semiconductor light detecting element (silicon substrate). In the semiconductor light detecting element, therefore, the travel distance of the light incident into the semiconductor light detecting element becomes long and the distance of absorption of light also becomes long. As a consequence, the sensitivity characteristic is improved in the near-infrared wavelength band.

Since the silicon substrate has the semiconductor layer with the higher impurity concentration than the epitaxial semiconductor layer, it induces recombination of unnecessary carriers generated independently of light on the surface side of the semiconductor layer. This recombination results in reduction in dark current. The semiconductor layer prevents carriers generated by light near the surface of the semiconductor layer from being trapped in the surface. For this reason, charge generated by light efficiently migrates to the photosensitive region, so as to achieve improvement in light detection sensitivity of the semiconductor light detecting element.

The semiconductor light detecting element may be configured as follows: the conductor comprises a photogate electrode provided on the surface of the epitaxial semiconductor layer, and first and second gate electrodes provided adjacent to the photogate electrode on the surface of the epitaxial semiconductor layer; the semiconductor light detecting element further comprises: first and second semiconductor regions formed in the epitaxial semiconductor layer, for reading out respective charges flowing from a region immediately below the photogate electrode to immediately below the first and second gate electrodes; the irregular asperity is formed at least in a surface opposed to the region immediately below the photogate electrode in the semiconductor layer. In this case, the sensitivity characteristic is improved in the near-infrared wavelength band, in the semiconductor light detecting element functioning as a range image sensor of a charge distribution method.

The semiconductor light detecting element may be configured as follows: a photodiode to generate charge in a quantity according to an intensity of incident light is formed as the photosensitive region in the epitaxial semiconductor layer, and the irregular asperity is formed at least in a surface opposed to the photodiode in the semiconductor layer. In this case, the sensitivity characteristic is improved in the near-infrared wavelength band, in the semiconductor light detecting element forming the photodiode.

The semiconductor light detecting element may further comprise: an amplification transistor to output a voltage value according to a quantity of charge input at a gate terminal thereof; a transfer transistor to transfer the charge generated in the photodiode, to the gate terminal of the amplification transistor; a discharge transistor to discharge the charge at the gate terminal of the amplification transistor; and a selection transistor to selectively output the voltage value output from the amplification transistor. In this case, it is feasible to realize the semiconductor light detecting element of the active pixel sensor system.

The semiconductor light detecting element may be configured as follows: the epitaxial semiconductor layer has a plurality of multiplication regions forming pn junctions at interfaces to the semiconductor layer and configured to achieve avalanche multiplication of carriers generated with incidence of light to be detected; the conductor includes a plurality of resistors each having two end portions, provided for the respective multiplication regions, electrically connected to the epitaxial semiconductor layer through one of the end portions, and connected to a signal conductor line through the other of the end portions; the irregular asperity is formed at least in a surface opposed to each of the multiplication regions in the semiconductor layer. In this case, the pn junctions are composed of the semiconductor layer and the epitaxial semiconductor layer formed on the semiconductor layer. The multiplication regions are formed in the epitaxial semiconductor layer where the pn junctions are realized, and each multiplication region is in this epitaxial semiconductor layer. Therefore, the semiconductor light detecting element has no ends (edges) of the pn junctions, which can cause edge breakdown in Geiger-mode operation, and therefore there is no need for provision of guard rings. For this reason, the semiconductor light detecting element can be formed with a higher aperture rate. The sensitivity characteristic is improved in the near-infrared wavelength band, in the semiconductor light detecting element constituting a photodiode array.

The semiconductor light detecting element may be configured as follows: the epitaxial semiconductor layer has a plurality of multiplication regions to achieve avalanche multiplication of carriers generated with incidence of light; semiconductor regions forming pn junctions at interfaces to the epitaxial semiconductor layer are formed corresponding to the multiplication regions in the epitaxial semiconductor layer; the conductor includes a plurality of resistors each having two end portions, provided for the respective semiconductor regions in the epitaxial semiconductor layer, electrically connected to the respective semiconductor regions in the epitaxial semiconductor layer through one of the end portions, and connected to a signal conductor line through the other of the end portions; the irregular asperity is formed at least in a surface opposed to each of the semiconductor regions in the semiconductor layer. In this case, the pn junctions are composed of the epitaxial semiconductor layer and the semiconductor regions formed in the semiconductor layer. The multiplication regions are formed in the epitaxial semiconductor layer where the pn junctions are realized, and each multiplication region is in this epitaxial semiconductor layer. Therefore, the semiconductor light detecting element has no ends (edges) of the pn junctions, which can cause edge breakdown in the Geiger-mode operation, and thus there is no need for provision of guard rings. For this reason, the semiconductor light detecting element can be formed with a higher aperture rate. The sensitivity characteristic is improved in the near-infrared wavelength band, in the semiconductor light detecting element constituting a photodiode array.

Advantageous Effect of Invention

The present invention provides the semiconductor light detecting element using the silicon substrate, as one having the practically sufficient sensitivity characteristic in the wavelength band including the near-infrared band.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

(First Embodiment)

Figure 1:
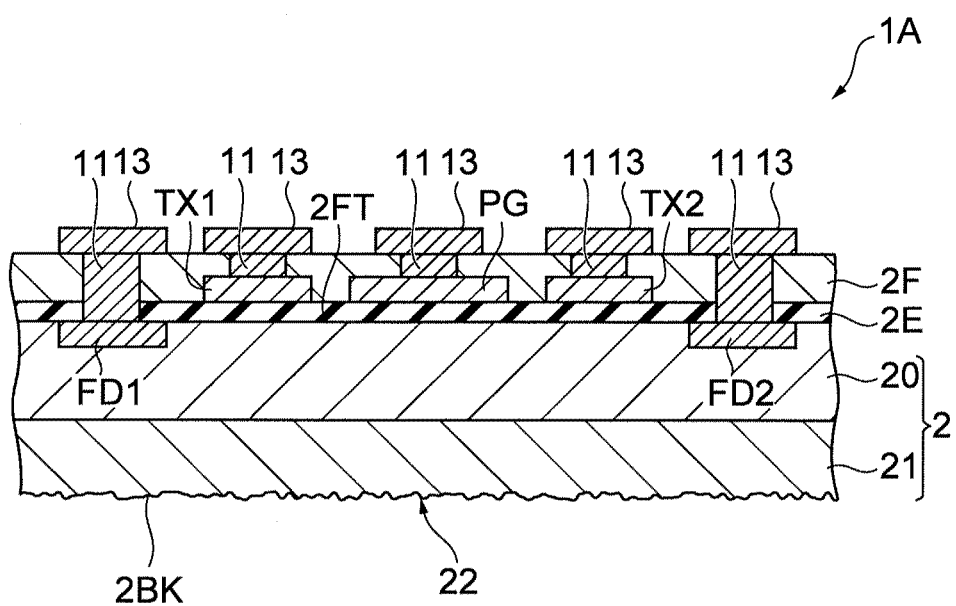
FIG. 1 is a drawing illustrating a cross-sectional configuration of a semiconductor light detecting element according to the first embodiment.

A configuration of a semiconductor light detecting element 1A according to the first embodiment will be described with reference to FIGS. 1 and 2. FIG. 1 is a drawing illustrating a cross-sectional configuration of the semiconductor light detecting element according to the first embodiment. The semiconductor light detecting element 1A of the first embodiment functions as a range image sensor of a charge distribution method.

The semiconductor light detecting element (range image sensor) 1A is provided with a semiconductor substrate 2, a photogate electrode PG, first and second gate electrodes TX1, TX2 (transfer electrodes), and first and second semiconductor regions FD1, FD2 (accumulation regions). The semiconductor substrate 2 has a light incident surface 2BK, and a front surface 2FT facing the light incident surface 2BK, or located opposite to the light incident surface 2BK. An insulating layer 2E is formed on the front surface 2FT of the semiconductor substrate 2. In the present example the semiconductor substrate 2 is comprised of silicon (Si) and the insulating layer 2E is comprised of $SiO_2$.

The semiconductor substrate 2 has a p-type (second conductivity type) epitaxial semiconductor layer 20 with a low impurity concentration on the front surface 2FT side and a semiconductor layer 21 on the light incident surface 2BK side. The semiconductor layer 21 has a higher impurity concentration than the epitaxial semiconductor layer 20 and in the present example it is a p-type semiconductor region. The light incident surface 2BK is a surface of the semiconductor layer 21 and the front surface 2FT is a surface of the epitaxial semiconductor layer 20. The semiconductor substrate 2 can be composed of an epitaxial substrate or an SOI epitaxial substrate, as described below.

The photogate electrode PG is provided through the insulating layer 2E on the front surface 2FT. The first and second gate electrodes TX1, TX2 are provided adjacent to the photogate electrode PG and through the insulating layer 2E on the front surface 2FT. The first and second semiconductor regions FD1, FD2 accumulate respective charges flowing into regions immediately below the respective gate electrodes TX1, TX2.

The photogate electrode PG has a rectangular shape on a plan view. The photogate electrode PG has a planar shape having first and second sides opposed to each other. A region corresponding to the photogate electrode PG in the semiconductor substrate 2 (i.e., a region immediately below the photogate electrode PG) functions as a photosensitive region in which charge is generated according to incident light. The photogate electrode PG is comprised of polysilicon, but it may be comprised of another material.

The first semiconductor region FD1 is arranged on the side where the first side of the photogate electrode PG is located, and along the first side. The second semiconductor region FD2 is arranged on the side where the second side of the photogate electrode PG is located, and along the second side. The first semiconductor region FD1 and the second semiconductor region FD2 are opposed to each other with the photogate electrode PG in between in a direction in which the first and second sides are opposed to each other (which will be referred to hereinafter simply as "opposed direction"). The first and second semiconductor regions FD1, FD2 have a rectangular shape on the plan view. The first and second semiconductor regions FD1, FD2 are regions of an n-type (first conductivity type) semiconductor with a high impurity concentration and are floating-diffusion regions.

The first gate electrode TX1 is provided between the photogate electrode PG and the first semiconductor region FD1. The second gate electrode TX2 is provided between the photogate electrode PG and the second semiconductor region FD2. The first and second gate electrodes TX1, TX2 have a rectangular shape on the plan view. The first and second gate electrodes TX1, TX2 are comprised of polysilicon, but these may be comprised of another material.

The thickness/impurity concentration/resistivity of each of the semiconductor regions are as described below.

Epitaxial semiconductor layer 20: thickness 5-10 μm/impurity concentration $1 \times 10^{12}$-$10^{15}$ cm$^{-3}$/resistivity 10-1000 mΩ·cm Semiconductor layer 21: thickness 2-10 μm/resistivity 10-20 mΩ·cm First and second semiconductor regions FD1, FD2: thickness 0.1-0.4 μm/impurity concentration $1 \times 10^{18}$-$10^{20}$ cm$^{-3}$ In the insulating layer 2E there are contact holes provided for exposing surfaces of the first and second semiconductor regions FD1, FD2. On the insulating layer 2E, an insulating layer 2F is formed so as to cover the photogate electrode PG and the first and second gate electrodes TX1, TX2. In the insulating layer 2F there are contact holes provided for exposing surfaces of the photogate electrode PG, the first and second gate electrodes TX1, TX2, and the first and second semiconductor regions FD1, FD2. In the contact holes, respective contact electrodes 11 are arranged as connected to the photogate electrode PG, the first and second gate electrodes TX1, TX2, and the first and second semiconductor regions FD1, FD2, respectively. Pad electrodes 13 connected to the respective contact electrodes 11 are arranged each on the insulating layer 2F. The semiconductor light detecting element 1A is provided with the photogate electrode PG, the first and second gate electrodes TX1, TX2, the contact electrodes 11, the pad electrodes 13, etc. as conductors.

When a high-level signal (e.g., a positive potential) is applied to the first and second gate electrodes TX1, TX2, gates formed by the first and second gate electrodes TX1, TX2 become open. Negative charge (electrons) is drawn toward the first and second gate electrodes TX1, TX2 to be accumulated in potential wells formed by the first and second semiconductor regions FD1, FD2. An n-type semiconductor contains a positively-ionized donor, has a positive potential, and attracts electrons. When a low-level signal (e.g., the ground potential) is applied to the first and second gate electrodes TX1, TX2, the gates formed by the first and second gate electrodes TX1, TX2 become closed. Charge generated in the semiconductor substrate 2 is not drawn into the first and second semiconductor regions FD1, FD2.

In the semiconductor light detecting element 1A, charge generated in a deep semiconductor portion in response to incidence of light for projection is pulled into a potential well provided in the vicinity of the charge generation position on the opposite side to the light incident surface 2BK. This enables the semiconductor light detecting element 1A to perform fast and accurate ranging.

Now, the semiconductor substrate 2 can be formed as described below.

Figure 2:
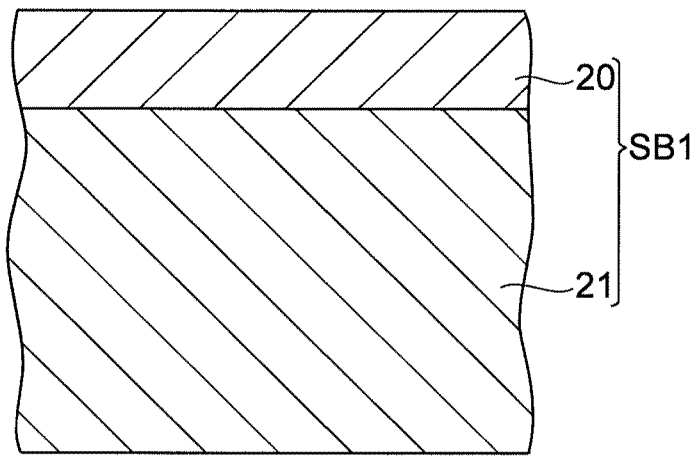
FIG. 2 is a drawing explaining a production process of a semiconductor substrate in the first embodiment.

First, as shown in FIG. 2, a semiconductor substrate SB1 as base material is prepared. The semiconductor substrate SB1 is a silicon substrate having the epitaxial semiconductor layer 20 and semiconductor layer 21, which is a substrate in which the epitaxial semiconductor layer 20 is grown (epitaxially grown) on the semiconductor layer 21 (which is so called an epitaxial substrate). The thickness of the semiconductor layer 21 in the semiconductor substrate SB1 is set to be larger than the thickness of the semiconductor layer 21 in the semiconductor light detecting element 1A. The thickness of the semiconductor layer 21 in the semiconductor substrate SB1 is set, for example, in the range of 400 to 700 μm.

Figure 3:
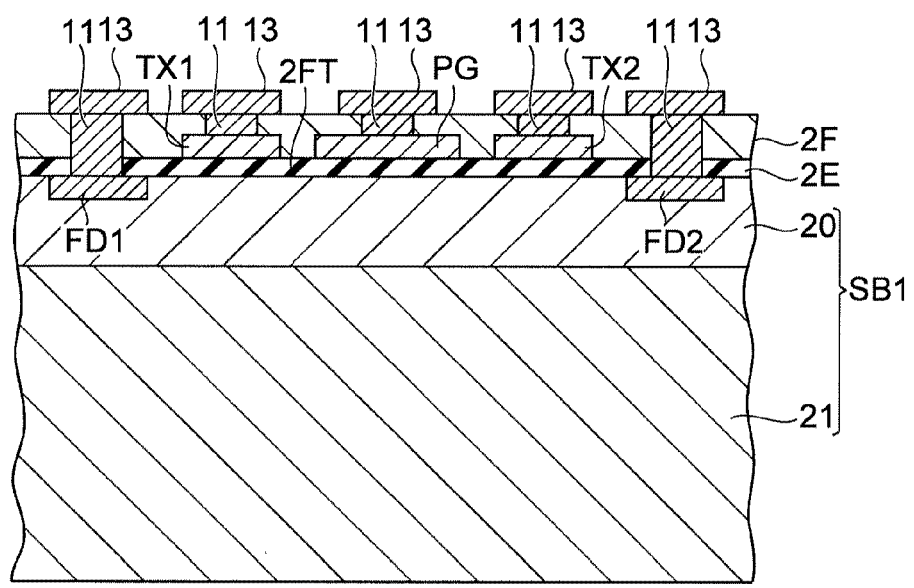
FIG. 3 is a drawing explaining the production process of the semiconductor substrate in the first embodiment.

Next, as shown in FIG. 3, the aforementioned first and second semiconductor regions FD1, FD2, insulating layers 2E, 2F, photogate electrode PC, first and second gate electrodes TX1, TX2, contact electrodes 11, and pad electrodes 13 are formed on the prepared semiconductor substrate SB1. Since methods of forming the first and second semiconductor regions FD1, FD2, insulating layers 2E, 2F, photogate electrode PG, first and second gate electrodes TX1, TX2, contact electrodes 11, and pad electrodes 13 are well known, the description thereof is omitted herein.

Figure 4:
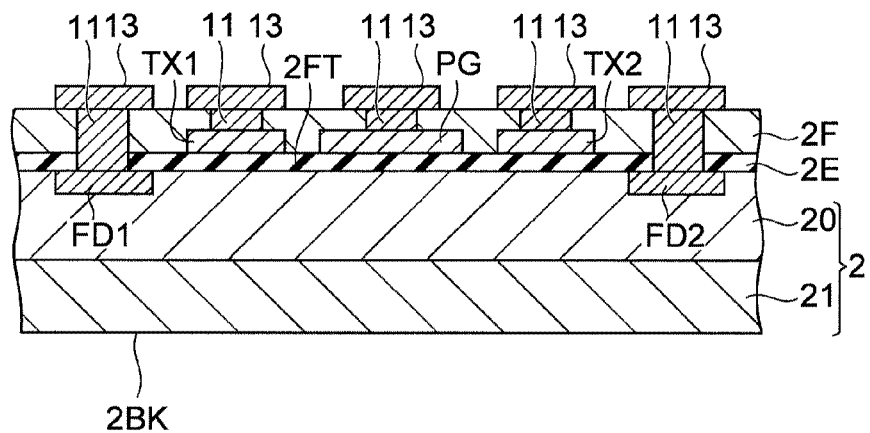
FIG. 4 is a drawing explaining the production process of the semiconductor substrate in the first embodiment.

Next, as shown in FIG. 4, the semiconductor substrate SB1 with the first and second semiconductor regions FD1, FD2, insulating layers 2E, 2F, photogate electrode PG, first and second gate electrodes TX1, TX2, contact electrodes 11, and pad electrodes 13 thereon is thinned. In this process, the semiconductor substrate SB1 is thinned by thinning the semiconductor layer 21. The thinning of the semiconductor layer 21 can be performed by etching, polishing, or the like.

The semiconductor substrate 2 can also be formed as described below.

Figure 5:
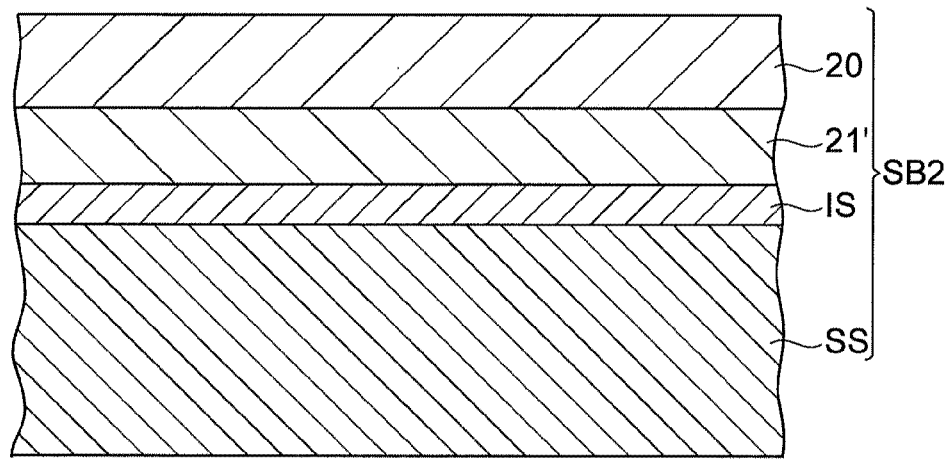
FIG. 5 is a drawing explaining the production process of the semiconductor substrate in the first embodiment.

First, as shown in FIG. 5, a semiconductor substrate SB2 as base material is prepared. The semiconductor substrate SB2 is made using a so-called SOI (Silicon on Insulator) substrate, and is a substrate in which the epitaxial semiconductor layer 20 is grown (epitaxially grown) on the SOI substrate (which is so called an SOI epitaxial substrate). The SOI substrate is obtained through the following process. A surface of a support substrate SS of Si crystal is oxidized to form an insulating layer IS of silicon oxide ($SiO_2$) on the surface of the support substrate SS. Then it is bonded to a semiconductor substrate 21' which will become the semiconductor layer 21, and thereafter thinning is performed so that the semiconductor substrate 21' comes to have a desired thickness. The thickness of the support substrate SS is set, for example, in the range of 400 to 700 μm. The insulating layer IS is set, for example, in the range of 0.3 to 0.7 μm. The thickness of the semiconductor substrate 21' is, for example, the same as the thickness of the semiconductor layer 21 and is set in the range of 2 to 10 μm.

Figure 6:
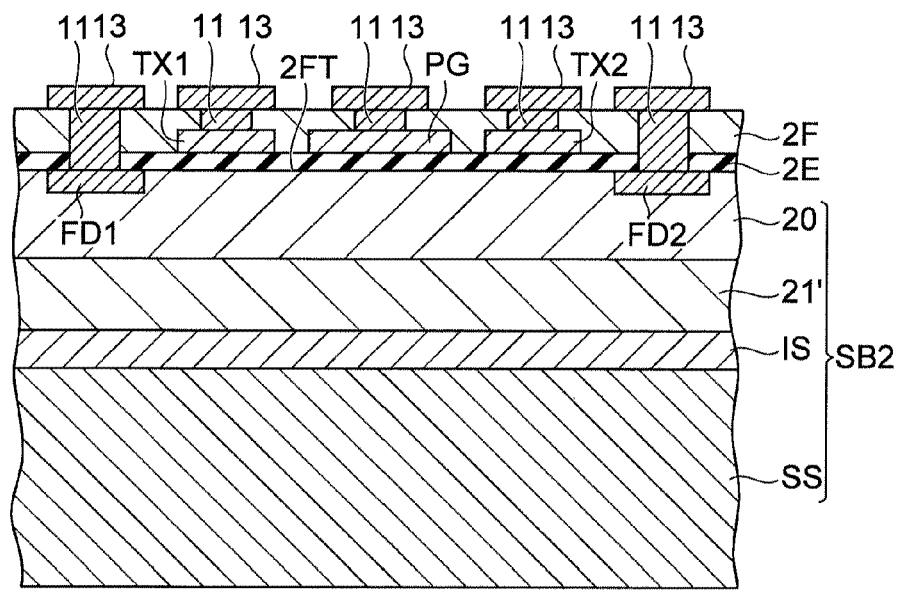
FIG. 6 is a drawing explaining the production process of the semiconductor substrate in the first embodiment.

Next, as shown in FIG. 6, the aforementioned first and second semiconductor regions FD1, FD2, insulating layers 2E, 2F, photogate electrode PG, first and second gate electrodes TX1, TX2, contact electrodes 11, and pad electrodes 13 are formed on the prepared semiconductor substrate SB2. Since methods of forming the first and second semiconductor regions FD1, FD2, insulating layers 2E, 2F, photogate electrode PG, first and second gate electrodes TX1, TX2, contact electrodes 11, and pad electrodes 13 are well known, the description thereof is omitted herein.

Figure 7:
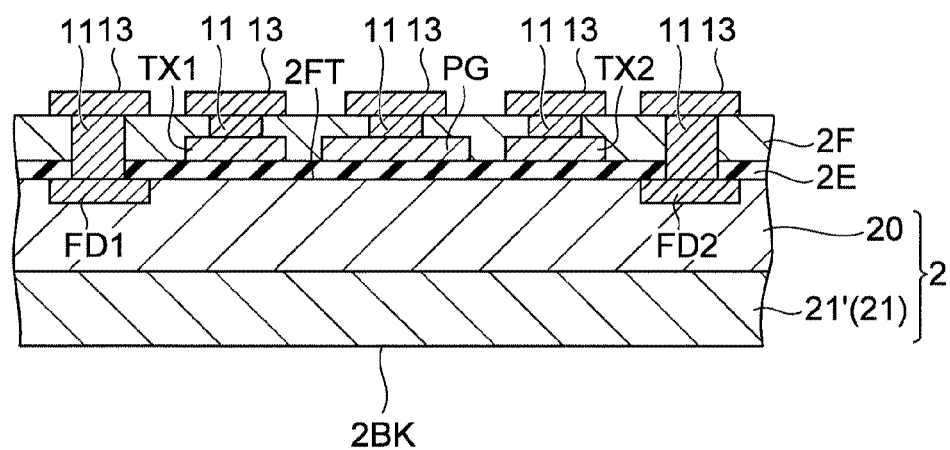
FIG. 7 is a drawing explaining the production process of the semiconductor substrate in the first embodiment.

Next, as shown in FIG. 7, the semiconductor substrate SB2 with the first and second semiconductor regions FD1, FD2, insulating layers 2E, 2F, photogate electrode PG, first and second gate electrodes TXT, TX2, contact electrodes 11, and pad electrodes 13 thereon is thinned. In this process, the semiconductor substrate SB2 is thinned by removing the support substrate SS and insulating layer IS. This causes the semiconductor substrate 21' (semiconductor layer 21) to be exposed. The removal of the support substrate SS and insulating layer IS can be implemented by etching, polishing, or the like. When the substrate used is one in which the epitaxial semiconductor layer 20 is grown on the SOI substrate with the semiconductor substrate 21' bonded through the insulating layer IS to the support substrate SS, it becomes easier to perform process control for thinning.

Irregular asperity 22 is formed in the light incident surface 2BK of the semiconductor substrate 2 (surface of semiconductor layer 21). The light incident surface 2BK is optically exposed. The sentence "the light incident surface 2BK is optically exposed" embraces not only a state in which the light incident surface 2BK is in contact with an atmospheric gas such as air, but also a state in which an optically transparent film is formed on the light incident surface 2BK. The irregular asperity 22 may be formed only in a region opposed to a region immediately below each photogate electrode PG.

The irregular asperity 22 is formed, after the thinning of the semiconductor layer 21, by applying pulsed laser light to the light incident surface 2BK of the semiconductor substrate 2, i.e., to the surface of the semiconductor layer 21. For example, the semiconductor substrate 2 is placed in a chamber with a gas inlet portion and a gas discharge portion and the pulsed laser light from a pulse laser generating device arranged outside the chamber is applied to the semiconductor substrate 2. In the chamber an inert gas stream is established by guiding an inert gas (e.g., nitrogen gas, argon gas, or the like) through the gas inlet portion and discharging it through the gas discharge portion. This setting allows dust and others made during the application of the pulsed laser light to be discharged to the outside of the chamber by the inert gas stream, thereby preventing processing debris, dust, etc. from adhering to the semiconductor substrate 2.

Figure 8:
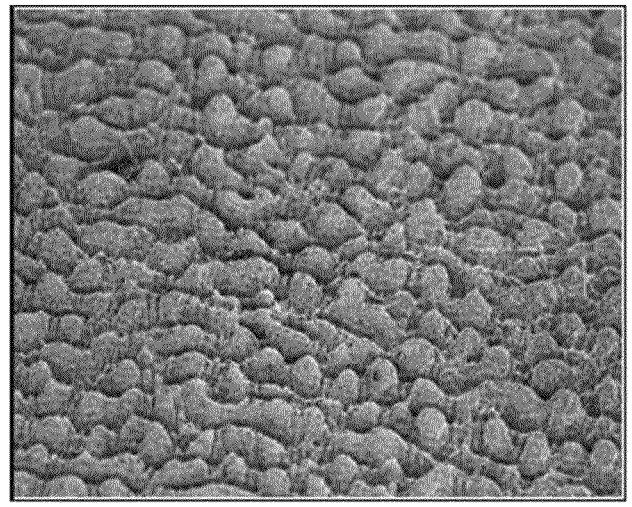
FIG. 8 is an SEM image obtained by observing the irregular asperity formed in the semiconductor substrate.

The present embodiment uses a picosecond-femtosecond pulse laser generating device as the pulse laser generating device to apply picosecond-femtosecond pulsed laser light to the entire area of the light incident surface 2BK. The light incident surface 2BK is roughened by the picosecond-femtosecond pulsed laser light, whereby the irregular asperity 22 is formed in the entire area of the light incident surface 2BK, as shown in FIG. 8. The irregular asperity 22 has faces intersecting with the direction perpendicular to the light incident surface 2BK (and the front surface 2FT). The height difference of the asperity 22 is, for example, about 0.5-10 μm and the spacing of projections in the asperity 22 is about 0.5-10 μm. The pulse duration of the picosecond-femtosecond pulsed laser light is, for example, about 50 fs-2 ps, the intensity, for example, about 4-16 GW, and the pulse energy, for example, about 200-800 μJ/pulse. More generally, the peak intensity is $3 \times 10^{11}$-$2.5 \times 10^{13}$ (W/cm$^2$), and the fluence about 0.1-1.3 (J/cm$^2$). FIG. 8 is an SEM image obtained by observing the irregular asperity 22 formed in the light incident surface 2BK.

In the semiconductor light detecting element 1A the irregular asperity 22 is formed in the light incident surface 2BK. For this reason, light incident from the light incident surface 2BK side of the semiconductor substrate 2 into the semiconductor substrate 2 is scattered, diffused, or reflected by the asperity 22 to travel through a long distance in the semiconductor substrate 2.

Normally, the refractive index n of Si=3.5, whereas the refractive index n of air=1.0. When light is incident from the direction normal to the light incident surface, light remaining unabsorbed in the silicon substrate is separated into a light component reflected on the back side opposite to the light incident surface and a light component transmitted by the silicon substrate. The light transmitted by the silicon substrate makes no contribution to sensitivity. The light component reflected by the back side opposite to the light incident surface becomes a photocurrent if absorbed in the silicon substrate. The light component still remaining unabsorbed in the silicon substrate is reflected or transmitted by the light incident surface as the light component reaching the back side opposite to the light incident surface was.

In the semiconductor light detecting element 1A, when light is incident from the direction normal to the light incident surface (light incident surface 2BK), the light is scattered or diffused by the irregular asperity 22 formed in the light incident surface 2BK, to travel in various directions. When the light reaches the front surface 2FT, light components arriving at angles of not less than 16.6° to the direction of emergence from the front surface 2FT are totally reflected by the front surface 2FT. Since light components traveling in the semiconductor substrate 2 travel in various directions because of the diffusion and the like by the asperity 22, they are extremely highly likely to be totally reflected on the front surface 2FT.

The light components totally reflected on the front surface 2FT travel again in the semiconductor substrate 2. When then arriving at the irregular asperity 22, light components arriving at angles of not less than 16.6° to the direction of emergence from the asperity 22 are totally reflected by the asperity 22. Since the asperity 22 is irregularly formed, it has various angles to the direction of emergence and the totally reflected light components travel in various directions in the semiconductor substrate 2.

The light components totally reflected on the front surface 2FT and on the light incident surface 2BK (irregular asperity 22) are repeatedly totally reflected on different faces so as to further increase the travel distance thereof. As the light incident into the semiconductor light detecting element 1A travels through the long distance inside the semiconductor substrate 2 as described above, it is absorbed by the semiconductor substrate 2 to generate charge. Therefore, the light incident into the semiconductor light detecting element 1A mostly travels through the long travel distance to be absorbed in the semiconductor substrate 2, without being transmitted by the semiconductor light detecting element 1A.

Accordingly, the semiconductor light detecting element 1A is improved in sensitivity characteristic in the near-infrared wavelength band.

If regular asperity is formed in the light incident surface 2BK, light components arriving at the front surface 2FT, though diffused by the asperity, travel in uniform directions. For this reason, the light components arriving at the front surface 2FT become less likely to be totally reflected. Therefore, this configuration increases light components transmitted by the front surface 2FT and further by the light incident surface 2BK, so as to decrease the travel distance of the light incident into the semiconductor light detecting element 1A. As a consequence, it becomes difficult to improve the sensitivity characteristic in the near-infrared wavelength band.

In the semiconductor light detecting element 1A, the semiconductor substrate 2 has the semiconductor layer 21 on the light incident surface 2BK side. This configuration induces recombination of unnecessary carriers generated independently of light on the light incident surface 2BK side, allowing reduction in dark current. The semiconductor layer 21 functions as an accumulation layer to prevent charge generated by light near the light incident surface 2BK from being trapped in the light incident surface 2BK. For this reason, the charge generated by light efficiently migrates to the region immediately below the photogate electrode PG, so as to further improve the light detection sensitivity of the semiconductor light detecting element 1A.

Figure 9:
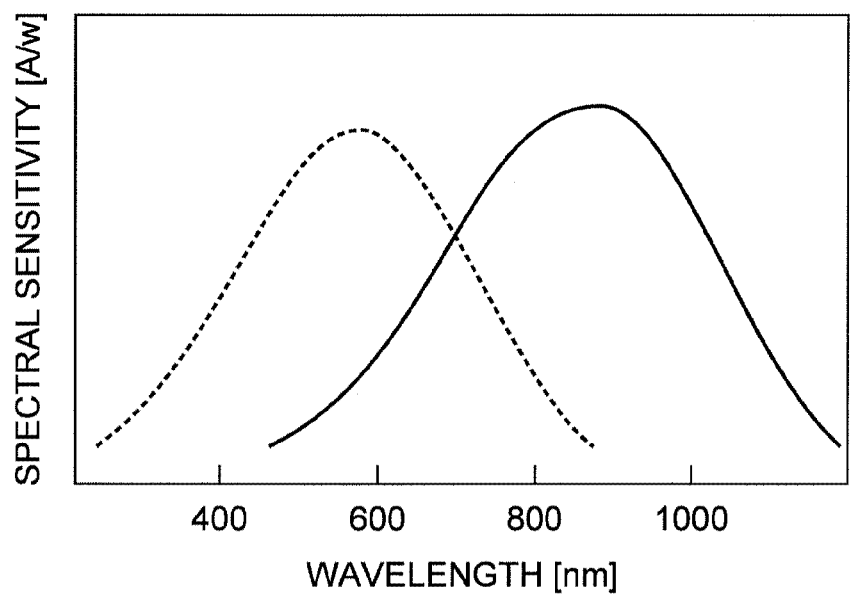
FIG. 9 is a drawing for explaining a difference in spectral sensitivity characteristic depending upon the presence and absence of the irregular asperity in the first embodiment.

In the semiconductor light detecting element 1A, when illustrating a difference in spectral sensitivity characteristic between the structure with the irregular asperity 22 and a structure without the irregular asperity 22, it is presumably as shown in FIG. 9. In this manner, the semiconductor light detecting element 1A can be improved in light detection sensitivity in the near-infrared region. FIG. 9 is a drawing for explaining the difference in spectral sensitivity characteristic depending upon the presence and absence of the irregular asperity. In FIG. 9, the spectral sensitivity characteristic of the structure with the irregular asperity 22 is indicated by a solid line and that of the structure without the irregular asperity 22 by a dashed line.

(Second Embodiment)

Figure 10:
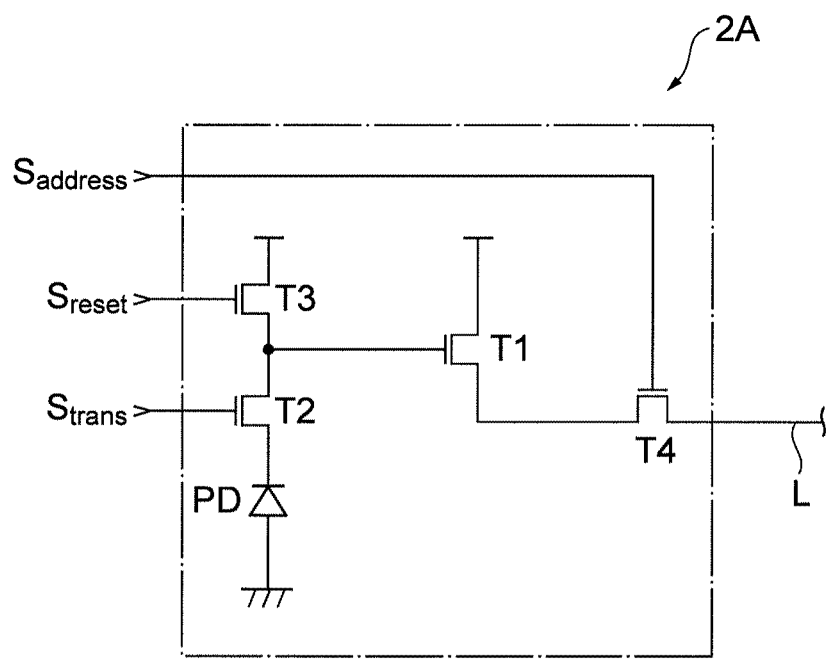
FIG. 10 is a circuit diagram of a semiconductor light detecting element according to the second embodiment.

A configuration of a semiconductor light detecting element 1B according to the second embodiment will be described with reference to FIGS. 10 and 11. FIG. 10 is a circuit diagram of the semiconductor light detecting element of the second embodiment. The semiconductor light detecting element 1B of the second embodiment functions as a semiconductor light detecting element (solid-state imaging device) of the active pixel sensor system.

The semiconductor light detecting element 1B has a plurality of light receiving portions arrayed one-dimensionally or two-dimensionally. Each light receiving portion, as shown in FIG. 10, includes a photodiode PD to generate charge in a quantity according to an intensity of incident light, an amplification transistor $T_1$ to output a voltage value according to a quantity of charge input to a gate terminal thereof, a transfer transistor $T_2$ to transfer the charge generated at the photodiode PD, to the gate terminal of the amplification transistor $T_1$, a discharge transistor $T_3$ to discharge the charge at the gate terminal of the amplification transistor $T_1$, and a selection transistor $T_4$ to output the voltage value output from the amplification transistor $T_1$, to an external line L. In FIG. 10 a region enclosed in a chain line corresponds to the aforementioned light receiving portion.

In the photodiode PD, an anode terminal thereof is set at the ground potential. The amplification transistor $T_1$ has a drain terminal set at a bias potential. The transfer transistor $T_2$ has a drain terminal connected to the gate terminal of the amplification transistor $T_1$ and a source terminal connected to a cathode terminal of the photodiode PD. The discharge transistor $T_3$ has a source terminal connected to the gate terminal of the amplification transistor $T_1$ and a drain terminal set at a bias potential. The selection transistor $T_4$ has a source terminal connected to a source terminal of the amplification transistor $T_1$ and a drain terminal connected to the line L. A constant current source is connected to the line L. The amplification transistor $T_1$ and the selection transistor $T_4$ constitute a source-follower circuit.

When a transfer control signal $S_{trans}$ is fed to a gate terminal of the transfer transistor $T_2$ and the transfer control signal $S_{trans}$ is at high level, the transfer transistor $T_2$ transfers the charge generated at the photodiode PD, to the gate terminal of the amplification transistor $T_1$. When a discharge control signal $S_{reset}$ is fed to a gate terminal of the discharge transistor $T_3$ and the discharge control signal $S_{reset}$ is at high level, the discharge transistor $T_3$ discharges the charge at the gate terminal of the amplification transistor $T_1$; when the transfer control signal $S_{trans}$ is also at high level at the same time, the discharge transistor $T_3$ resets the photodiode PD. When a row selection control signal $S_{address}$ is fed to a gate terminal of the selection transistor $T_4$ and the row selection control signal $S_{address}$ is at high level, the selection transistor $T_4$ outputs the voltage value output from the amplification transistor $T_1$, to the external line L.

In each light receiving portion configured as described above, when the transfer control signal $S_{trans}$ is at low level and the discharge control signal $S_{reset}$ is at high level, the charge at the gate terminal of the amplification transistor $T_1$ is discharged. When the row selection control signal $S_{address}$ is at high level, the voltage value (dark signal component) output from the amplification transistor $T_1$ in an initialized state is output via the selection transistor $T_4$ to the line L. When the discharge control signal $S_{reset}$ is at low level and when the transfer control signal $S_{trans}$ and the row selection control signal $S_{address}$ each are at high level, the charge generated at the photodiode PD is fed to the gate terminal of the amplification transistor $T_1$. Then the voltage value (bright signal component) output from the amplification transistor $T_1$ according to the quantity of the charge is output via the selection transistor $T_4$ to the line L.

Each of the transfer control signal $S_{trans}$, the discharge control signal $S_{reset}$, and the row selection control signal $S_{address}$ is output from an unillustrated control circuit to be fed through a line to the light receiving portion. The voltage values (dark signal component and bright signal component) output from the selection transistor $T_4$ in each light receiving portion to the line L are fed to an unillustrated signal processing circuit and this signal processing circuit calculates a difference voltage value (=bright signal component−dark signal component) and outputs it.

Figure 11:
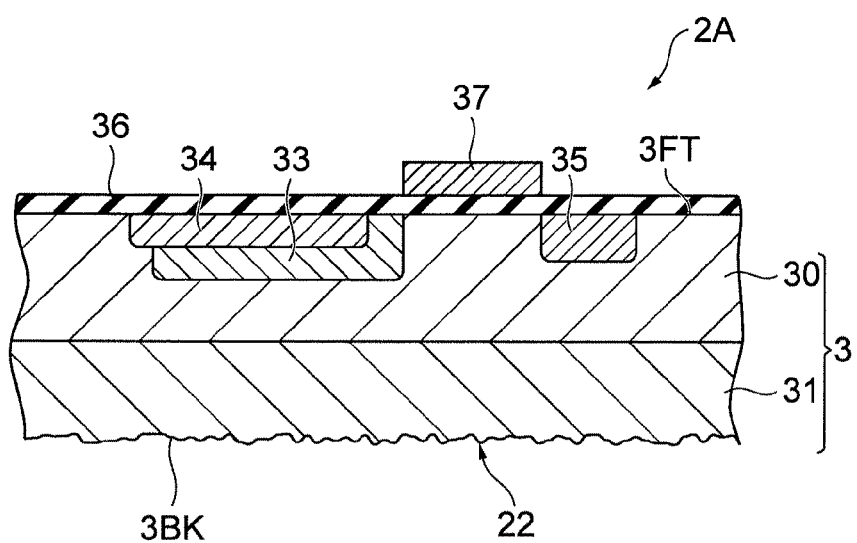
FIG. 11 is a drawing illustrating a cross-sectional configuration of the semiconductor light detecting element according to the second embodiment.

FIG. 11 is a drawing illustrating a cross-sectional configuration of the semiconductor light detecting element according to the second embodiment. FIG. 11 shows only the photodiode PD and the transfer transistor $T_2$ shown in FIG. 10, without illustration of the circuit including the other transistors $T_1$, $T_3$, $T_4$ and the various lines.

A semiconductor substrate 3 has a p-type epitaxial semiconductor layer 30 with a low impurity concentration on the light incident surface 3FT side and a semiconductor layer 31 on the back surface 3BK side. The semiconductor layer 31 has a higher impurity concentration than the epitaxial semiconductor layer 30 and in the present example it is a p-type semiconductor region. The light incident surface 3FT is a surface of the epitaxial semiconductor layer 30 and the back surface 3BK is a surface of the semiconductor layer 31. The semiconductor substrate 3, as in the first embodiment, can be constructed using an epitaxial substrate or an SOI epitaxial substrate. The light receiving portions are arrayed on the light incident surface 3FT side of the semiconductor substrate 3. In the present example the semiconductor substrate 3 is a silicon substrate of silicon (Si).

Each light receiving portion is provided with an n⁻ type first semiconductor region 33 formed in a predetermined region of the epitaxial semiconductor layer 30, a p⁺ type second semiconductor region 34 formed on the first semiconductor region 33 and the periphery thereof, an n⁺ type third semiconductor region 35 formed with a space relative to the first semiconductor region 33, and a gate electrode 37 provided through an insulating film 36 on the semiconductor substrate 3 and between the first semiconductor region 33 and the third semiconductor region 35. The first semiconductor region 33 is an n-type region with a relatively low impurity concentration. The second semiconductor region 34 is a p-type region with a relatively high impurity concentration. The third semiconductor region 35 is an n-type region with a relatively high impurity concentration.

In the present embodiment, the phrase "relatively high impurity concentration" refers, for example, to the impurity concentration of not less than about $1 \times 10^{16}$ cm⁻³, and is represented by "+" attached to conductivity type. The phrase "relatively low impurity concentration" refers to the impurity concentration of not more than about $1 \times 10^{15}$ cm⁻³ and is represented by "−" attached to conductivity type. The n-type impurities include antimony (Sb), arsenic (As), and so on and the p-type impurities include boron (B) and others.

The thickness/impurity concentration/resistivity of each of the semiconductor regions are as described below.
Epitaxial semiconductor layer 30: thickness 5-10 μm/impurity concentration $1 \times 10^{12}$-$10^{15}$ cm⁻³/resistivity 10-1000 mΩ·cm
Semiconductor layer 31: thickness 2-10 μm/resistivity 10-20 mΩ·cm
First semiconductor region 33: thickness 0.5-3 μm/impurity concentration $1 \times 10^{15}$-$10^{17}$ cm⁻³
Second semiconductor region 34: thickness 0.1-0.3 μm/impurity concentration $1 \times 10^{17}$-$10^{20}$ cm⁻³
Third semiconductor region 35: thickness 0.1-0.5 μm/impurity concentration $1 \times 10^{17}$-$10^{20}$ cm⁻³

In each light receiving portion, the epitaxial semiconductor layer 30, first semiconductor region 33, and second semiconductor region 34 constitute the photodiode PD of an embedded type. The epitaxial semiconductor layer 20, first semiconductor region 33, third semiconductor region 35, and gate electrode 37 constitute the transfer transistor T2 of the field effect type. Namely, the gate electrode 37 corresponds to the gate terminal of the transfer transistor T2, the first semiconductor region 33 to the source terminal of the transfer transistor T2, and the third semiconductor region 35 to the drain terminal of the transfer transistor T2. The gate electrode 37 is arranged through the insulating film 36 on the front surface side of the epitaxial semiconductor layer 30. The semiconductor light detecting element 1B is provided with the gate electrodes 37, electrodes for constructing the transistors $T_1$, $T_3$, $T_4$, various lines, and others as conductors.

The line connected to the third semiconductor region 35 (drain terminal of transfer transistor $T_2$) is connected to the pixel circuit (other transistors $T_1$, $T_3$, $T_4$). The line connected to the gate electrode 37 (gate terminal of transfer transistor $T_2$) is connected to an unillustrated control circuit.

The irregular asperity 22 is formed in the back surface 3BK of the semiconductor substrate 3 (surface of semiconductor layer 31). The back surface 3BK is optically exposed. The sentence "the back surface 3BK is optically exposed" embraces not only a state in which the back surface 3BK is in contact with an atmospheric gas such as air, but also a state in which an optically transparent film is formed on the back surface 3BK. The irregular asperity 22 is formed by applying the pulsed laser light to the surface of the semiconductor layer 31, as described above. The irregular asperity 22 may be formed only in a region opposed to each photodiode PD.

In the semiconductor light detecting element 1B, the irregular asperity 22 is formed in the back surface 3BK. For this reason, light incident through the light incident surface 3FT side of the semiconductor substrate 3 into the semiconductor substrate 3 travels inside the semiconductor substrate 3 and then is reflected, scattered, or diffused by the asperity 22 to travel through a long distance in the semiconductor substrate 3. When light is incident from the direction normal to the light incident surface 3FT and when the light reaches the irregular asperity 22 formed in the back surface 3BK, light components arriving at angles of not less than 16.6° to the direction of emergence from the asperity 22 are totally reflected by the asperity 22. Since the asperity 22 is irregularly formed, it has various angles to the direction of emergence and the totally reflected light components are diffused into various directions. Therefore, the totally reflected light components include light components absorbed inside the semiconductor substrate 3 and light components arriving at the light incident surface 3FT.

Since the light components arriving at the light incident surface 3FT travel in various directions because of the diffusion by the asperity 22, the light components arriving at the light incident surface 3FT are extremely highly likely to be totally reflected by the light incident surface 3FT. The light components totally reflected on the light incident surface 3FT are repeatedly totally reflected on different faces to further increase the travel distance thereof. As the light incident into the semiconductor light detecting element 1B travels through the long distance inside the semiconductor substrate 3, the light is absorbed in the semiconductor substrate 3 to be detected as photocurrent.

In this manner, the light incident into the semiconductor light detecting element 1B mostly travels through the long travel distance to be absorbed in the semiconductor substrate 3, without being transmitted by the semiconductor light detecting element 1B. Accordingly, the semiconductor light detecting element 1B is improved in sensitivity characteristic in the near-infrared wavelength band.

In the semiconductor light detecting element 1B, the semiconductor layer 31 induces recombination of unnecessary carriers generated independently of light on the back surface 3BK side, so as to enable reduction in dark current. The semiconductor layer 31 functions as an accumulation layer to prevent the charge generated by light near the back surface 3BK from being trapped in the back surface 3BK. For this reason, the charge generated by light efficiently migrates to the photodiode PD (light receiving portion), so as to further improve the light detection sensitivity of the semiconductor light detecting element 1B.

(Third Embodiment)

Figure 12:
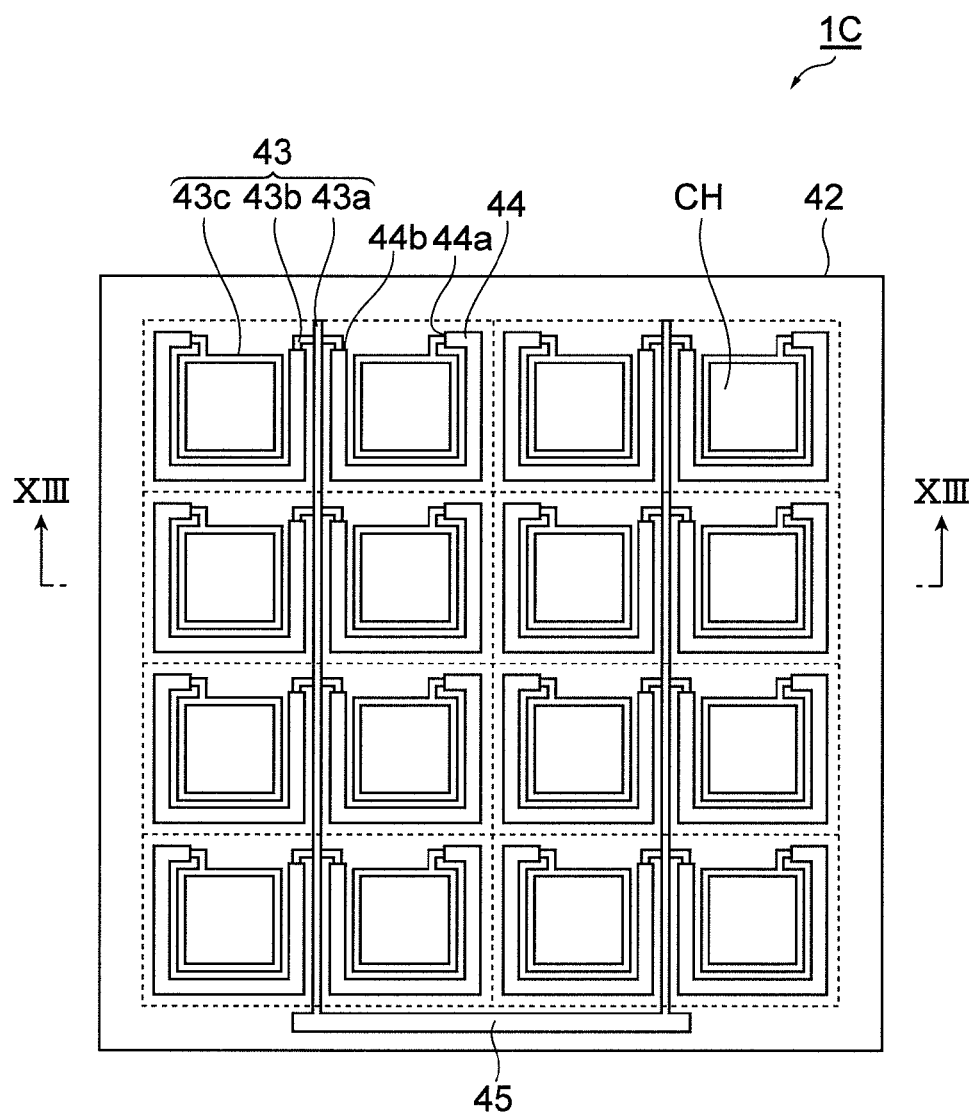
FIG. 12 is a plan view schematically illustrating a semiconductor light detecting element according to the third embodiment.
Figure 13:
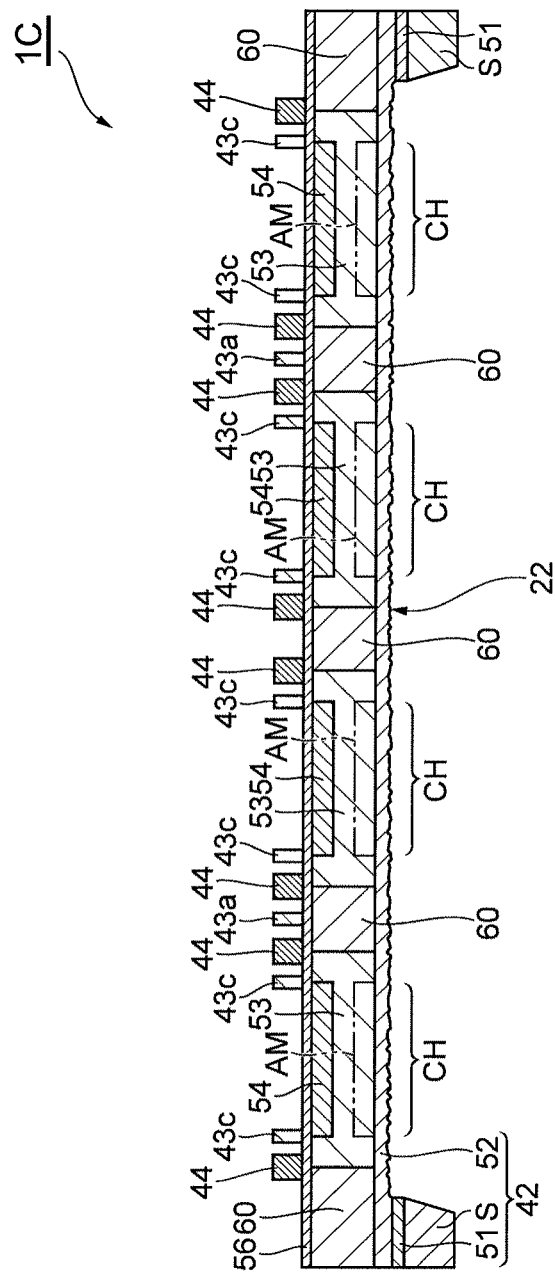
FIG. 13 is a drawing illustrating a cross-sectional configuration along the line XIII-XIII in FIG. 12.

A configuration of a semiconductor light detecting element 1C according to the third embodiment will be described with reference to FIGS. 12 and 13. FIG. 12 is a plan view schematically showing the semiconductor light detecting element of the third embodiment. FIG. 13 is a drawing showing a cross-sectional configuration along the line XIII-XIII of the semiconductor light detecting element shown in FIG. 12. The semiconductor light detecting element 1C of the third embodiment functions as a photodiode array.

The semiconductor light detecting element 1C is one in which a plurality of semiconductor layers and an insulating layer are laminated together on a substrate 42. As shown in FIG. 12, the semiconductor light detecting element 1C is a multichannel avalanche photodiode array for photon counting in which a plurality of light detecting channels CH to which light to be detected is made incident are formed in a matrix (4×4 in the present embodiment). On the top surface side of the semiconductor light detecting element 1C there are signal conductor lines 43, resistors 44, and electrode pads 45 provided. The substrate 42 has, for example, a square shape about 1 mm on each side. Each light detecting channel CH has, for example, a square shape.

A signal conductor line 43 consists of a readout portion 43a to transport signals output from the respective light detecting channels CH, connection portions 43b to connect the resistors 44 to the readout portion 43a, and channel peripheral portions 43c laid so as to surround the peripheries of the respective light detecting channels CH. The readout portion 43a is connected to each of the light detecting channels CH arranged in two columns adjacent with the readout portion 43a in between and is connected to an electrode pad 45 at one end thereof. Since in the present embodiment the photodiodes are arranged in the matrix of 4×4, two readout portions 43a are laid on the semiconductor light detecting element 1C. Each readout portion 43a is connected to the electrode pad 45. The signal conductor lines 43 are comprised, for example, of aluminum (Al).

The resistors 44 are provided for the respective light detecting channels CH through one end portion 44a and channel peripheral portion 43c and connected through the other end portion 44b and connection portion 43b to the readout portion 43a. A plurality of (eight in the present embodiment) resistors 44 connected to one readout portion 43a are connected to the readout portion 43a. The resistors 44 are comprised, for example, of polysilicon (Poly-Si).

Next, a cross-sectional configuration of the semiconductor light detecting element 1C will be described with reference to FIG. 13. As shown in FIG. 13, the semiconductor light detecting element 1C is provided with a substrate 42, a p⁻ type semiconductor layer 53, p⁺ type semiconductor regions 54, a protecting film 56, a separating portion 60, and the aforementioned signal conductor lines 43 and resistors 44. The substrate 42 has a semiconductor layer of the n-type conductivity (first conductivity type). The p⁻ type semiconductor layer 53 is formed on the substrate 42 and has the p-type conductivity (second conductivity type). The p⁺ type semiconductor regions 54 are formed on the p⁻ type semiconductor layer 53 and have the p-type conductivity. The separating portion 60 is formed in the p⁻ type semiconductor layer 53 and has the n-type conductivity (first conductivity type). The aforementioned signal conductor lines 43 and resistors 44 are formed on the protecting film 56. The light to be detected is incident either from the top side or from the bottom side in FIG. 13. The semiconductor light detecting element 1C is provided with the signal conductor lines 43, the resistors 44, and others as conductors.

The substrate 42 has a substrate member S, an insulating layer 51 formed on the substrate member S, and an n⁺ type semiconductor layer 52 formed on the insulating layer 51. The substrate member S is comprised of Si (silicon). The insulating layer 51 is comprised, for example, of SiO₂ (silicon oxide). The n⁺type semiconductor layer 52 is comprised of Si and is a semiconductor layer of the n-type conductivity with a high impurity concentration. The thickness of the n⁺type semiconductor layer 52 is, for example, from 1 μm to 12 μm.

The p⁻ type semiconductor layer 53 is an epitaxial semiconductor layer with a low impurity concentration and of the p-type conductivity. The p⁻ type semiconductor layer 53 constitutes pn junctions at interfaces to the substrate 42. The p⁻ type semiconductor layer 53 has a plurality of multiplication regions AM to achieve avalanche multiplication of carriers generated with incidence of light to be detected, corresponding to the respective light detecting channels CH. The thickness of the p⁻ type semiconductor layer 53 is, for example, from 3 μm to 5 μm. The p⁻ type semiconductor layer 53 is comprised of Si. Therefore, the n⁺ type semiconductor layer 52 and p⁻ type semiconductor layer 53 constitute a semiconductor substrate (silicon substrate).

The p⁺ type semiconductor regions 54 are formed corresponding to the multiplication regions AM of the respective light detecting channels CH on the p⁻ type semiconductor layer 53. Namely, regions near the interfaces to the substrate 42 of the p⁻ type semiconductor layer 53 located below the p⁺ type semiconductor regions 54 in the lamination direction of semiconductor layers (which will be referred to hereinafter simply as lamination direction) are the multiplication regions AM. The p⁺ type semiconductor regions 54 are comprised of Si.

The separating portion 60 is formed between the plurality of light detecting channels CH to separate the light detecting channels CH from each other. Namely, the separating portion 60 is formed so that the multiplication regions AM are formed in one-to-one correspondence to the respective light detecting channels CH in the p⁻ type semiconductor layer 53. The separating portion 60 is formed in a two-dimensional grid pattern on the substrate 42 so as to completely surround the periphery of each multiplication region AM. The separating portion 60 is formed so as to penetrate the p⁻ type semiconductor layer 53 from the top side to the bottom side in the lamination direction. The separating portion 60 contains an impurity, e.g., P and is a semiconductor layer with a high impurity concentration and of the n-type conductivity. If the separating portion 60 is formed by diffusion, it will require a long thermal treatment time. For this reason, the impurity in the n⁺ type semiconductor layer 52 will diffuse into the epitaxial semiconductor layer to presumably cause a rise at the interfaces of pn junctions. For preventing this rise, the separating portion 60 may be formed by first forming trenches by etching near centers of regions corresponding to the separating portion 60 and thereafter performing the diffusion of the impurity. The trench grooves may be filled with a material that absorbs or reflects light in the wavelength band to be absorbed by the light detecting channels, so as to form light shield portions. In this case, it is also feasible to prevent crosstalk from occurring due to influence of emission of light by avalanche multiplication on the light detecting channels.

The p⁻ type semiconductor layer 53, p⁺ type semiconductor regions 54, and separating portion 60 form a plane on the top side of the semiconductor light detecting element 1C and the protecting film 56 is formed on these. The protecting film 56 is formed, for example, of an insulating layer of SiO₂.

The signal conductor lines 43 and resistors 44 are formed on the protecting film 56. The readout portions 43a of the signal conductor lines 43 and the resistors 44 are formed above the separating portion 60.

The signal conductor lines 43 function as anodes. As a cathode, a transparent electrode layer (e.g., a layer of ITO (Indium Tin Oxide)), which is not shown, may be provided over the entire surface on the bottom side of the substrate 42

(the side without the insulating layer 51). As another example, the cathode may be an electrode portion formed so as to be led to the front side.

Figure 14:
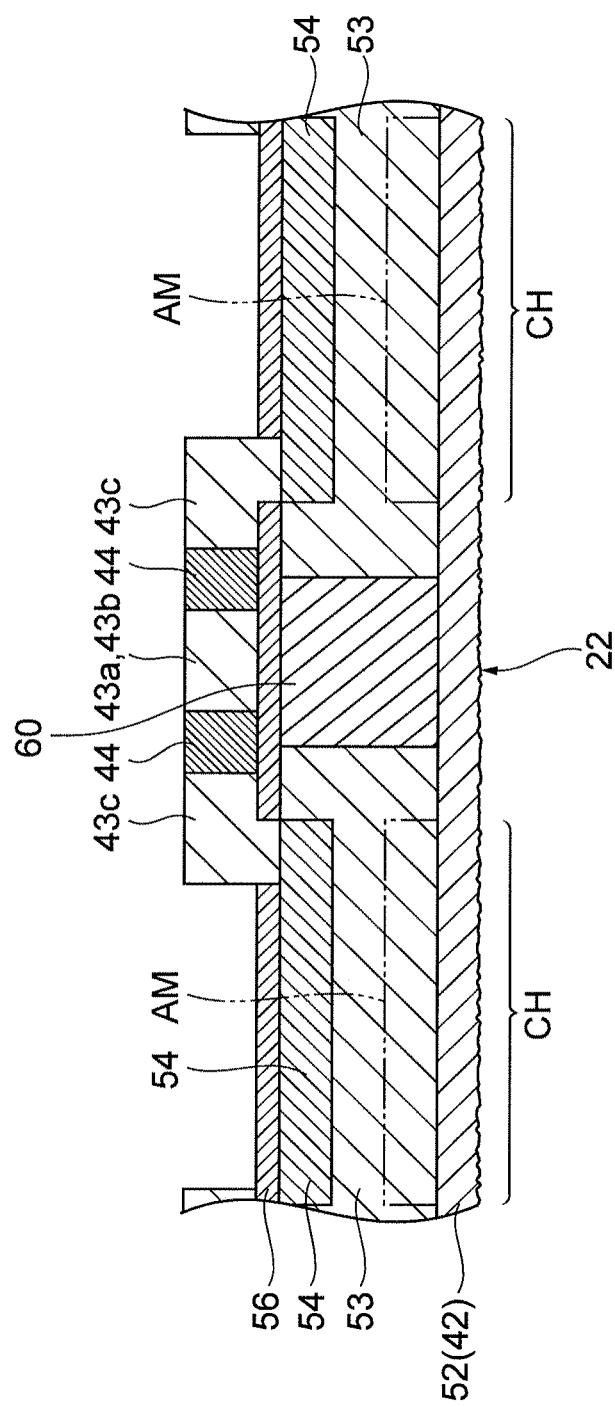
FIG. 14 is a drawing for schematically explaining a connection relation of each light detecting channel with a signal conductor line and a resistor.

The below will describe a connection relation of each light detecting channel CH to the signal conductor line 43 and resistor 44, with reference to FIG. 14. FIG. 14 is a drawing for schematically explaining the connection relation of each light detecting channel to the signal conductor line and resistor.

As shown in FIG. 14, the p$^+$ type semiconductor region 54 of each light detecting channel CH is directly connected to the signal conductor line 43 (channel peripheral portion 43c). This connection makes the signal conductor line 43 (channel peripheral portion 43c) and the p$^-$ type semiconductor layer 53 electrically connected. The p$^-$ type semiconductor layer 53 and one end portion 44a of resistor 44 are connected through the signal conductor line 43 (channel peripheral portion 43c). The resistor 44 has the other end portion 44b connected through the connection portion 43b to the readout portion 43a.

In the substrate 42, the region where the plurality of light detecting channels CH are formed is thinned from the substrate member S side so as to remove the portion corresponding to the region where the plurality of light detecting channels CH are formed in the substrate member S. The substrate member S is present as a frame portion in the periphery of the thinned region. The frame portion may also be removed whereby the substrate 42 has a configuration wherein the entire region is thinned or the entire substrate member S is removed. The removal of the substrate member can be implemented by etching (e.g., dry etching or the like), polishing, or the like. When the substrate member S is removed by dry etching, the insulating layer 51 also functions as an etching stop layer. The insulating layer 51 that is exposed by removal of the substrate member S is removed as described below.

The irregular asperity 22 is formed in the surface of the n$^+$type semiconductor layer 52 and throughout the entire region where the plurality of light detecting channels CH are formed. The region where the irregular asperity 22 is formed in the surface of the n$^+$type semiconductor layer 52 is optically exposed. The sentence "the surface of the n$^+$type semiconductor layer 52 is optically exposed" embraces not only a state in which the surface of the n$^+$type semiconductor layer 52 is in contact with an atmospheric gas such as air, but also a state in which an optically transparent film is formed on the surface of the n$^+$type semiconductor layer 52. The irregular asperity 22 may be formed only in regions opposed to the respective light detecting channels CH. The irregular asperity 22 is formed by applying the pulsed laser light to the insulating layer 51 exposed by removal of the substrate member S, as in the aforementioned embodiment.

When the semiconductor light detecting element 1C is used for photon counting, it is operated under an operation condition called the Geiger mode. In the Geiger-mode operation, a reverse voltage (e.g., 50 V or more) higher than the breakdown voltage is applied to each light detecting channel CH. In this state, when light to be detected is incident from the top side into each light detecting channel CH, the light to be detected is absorbed in each light detecting channel CH to generate carriers. The carriers thus generated migrate as accelerated according to an electric field in each light detecting channel CH, to be multiplied in each multiplication region AM. Then the multiplied carriers are taken through the resistor 44 to the outside by the signal conductor line 43 to be detected based on a wave height value of an output signal thereof. The channels detecting photon provide outputs all in an identical quantity and thus a total of the outputs from all the channels is detected, thereby to count how many light detecting channels CH provided outputs in the semiconductor light detecting element 1C. Therefore, the semiconductor light detecting element 1C performs photon counting by single irradiation of light to be detected.

Incidentally, since in the semiconductor light detecting element 1C the irregular asperity 22 is formed in the surface of the n$^+$ type semiconductor layer 52, the light incident into the semiconductor light detecting element 1C is reflected, scattered, or diffused by the irregular asperity 22. Therefore, the light incident into the semiconductor light detecting element 1C travels through a long distance in the semiconductor light detecting element 1C.

When the semiconductor light detecting element 1C is used as a front illuminated type photodiode array, the light is incident from the protecting film 56 side into the semiconductor light detecting element 1C. When the light incident into the semiconductor light detecting element 1C reaches the irregular asperity 22 formed in the surface of the n$^+$ type semiconductor layer 52, light components arriving at angles of not less than 16.6° to the direction of emergence from the irregular asperity 22 are totally reflected by the irregular asperity 22. Since the irregular asperity 22 is irregularly formed, it has various angles to the direction of emergence and the totally reflected light components diffuse into various directions. For this reason, the totally reflected light components include light components absorbed in each light detecting channel CH and light components reaching the surface on the protecting film 56 side and the side faces of the n$^+$ type semiconductor layer 52.

The light components reaching the surface on the protecting film 56 side and the side faces of the n$^+$ type semiconductor layer 52 travel in various directions because of diffusion by the irregular asperity 22. For this reason, the light components reaching the surface on the protecting film 56 side and the side faces of the n$^+$ type semiconductor layer 52 are extremely highly likely to be totally reflected on the surface on the protecting film 56 side and the side faces of the n$^+$ type semiconductor layer 52. The light components totally reflected on the surface on the protecting film 56 side and the side faces of the n$^+$ type semiconductor layer 52 are repeatedly totally reflected on different faces to further increase the travel distance thereof. As the light incident into the semiconductor light detecting element 1C travels through the long distance inside the semiconductor light detecting element 1C, it is absorbed in each light detecting channel CH to be detected as photocurrent.

When the semiconductor light detecting element 1C is used as a back illuminated type photodiode array, the light is incident from the surface side of the n$^+$ type semiconductor layer 52 into the semiconductor light detecting element 1C. The light incident into the semiconductor light detecting element 1C is scattered by the irregular asperity 22 to travel in various directions inside the semiconductor light detecting element 1C. The light components reaching the surface on the protecting film 56 side and the side faces of the n$^+$ type semiconductor layer 52 travel in various directions because of diffusion by the irregular asperity 22. For this reason, the light components reaching the surface on the protecting film 56 side and the side faces of the n$^+$ type semiconductor layer 52 are extremely highly likely to be totally reflected on each face. The light components totally reflected on the surface on the protecting film 56 side and the side faces of the n$^+$ type semiconductor layer 52 are repeatedly totally reflected on different faces and reflected, scattered, or diffused by the irregular asperity 22, to further increase the travel distance thereof. As the light incident into the semiconductor light detecting element 1C is reflected, scattered, or diffused by the irregular asperity 22, so as to travel through the long distance in the semiconductor light detecting element 1C, it is absorbed in each light detecting channel CH to be detected as photocurrent.

The light incident into the semiconductor light detecting element 1C mostly travels through the long travel distance to be absorbed in each light detecting channel CH, without being transmitted by the semiconductor light detecting element 1C. Therefore, the semiconductor light detecting element 1C is improved in spectral sensitivity characteristic in the near-infrared wavelength band.

In the third embodiment the irregular asperity 22 is formed in the surface of the $n^+$ type semiconductor layer 52. This configuration induces recombination of unnecessary carriers generated independently of light on the surface side where the irregular asperity 22 is formed, so as to enable reduction in dark current. The $n^+$ type semiconductor layer 52 functions as an accumulation layer to prevent carriers generated by light near the surface of the $n^+$ type semiconductor layer 52, from being trapped in the surface. For this reason, the carriers generated by light efficiently migrate to the multiplication regions AM, so as to improve the light detection sensitivity of the semiconductor light detecting element 1C.

In the third embodiment, the irregular asperity 22 is also formed in the surface corresponding to spaces between the light detecting channels CH in the $n^+$ type semiconductor layer 52 and the surface is optically exposed. For this reason, light incident into the spaces between the light detecting channels CH is also reflected, scattered, or diffused by the irregular asperity 22 to be absorbed by any one of the light detecting channels CH. Therefore, the detection sensitivity is kept from being lowered between the light detecting channels CH, thereby achieving further improvement in the light detection sensitivity of the semiconductor light detecting element 1C. Incidentally, the plurality of light detecting channels CH are formed in the third embodiment, but each light detecting channel CH is not provided for detecting the position of incidence of light and the output is the sum of outputs from the respective light detecting channels CH. For this reason, crosstalk between light detecting channels CH causes no problem and it is sufficient that the incident light is detected by any one of the light detecting channels CH.

In the third embodiment, the pn junctions are constructed of the $n^+$ type semiconductor layer 52 in the substrate 42 and the p type semiconductor layer 53 of the epitaxial semiconductor layer formed on the $n^+$ type semiconductor layer 52 in the substrate 42, in the semiconductor light detecting element 1C. The multiplication regions AM are formed in the $p^-$ type semiconductor layer 53 where the pn junctions are realized, and correspondence of each multiplication region AM to each light detecting channel CH is realized by the separating portion 60 formed between the light detecting channels CH. Since a pn junction surface is composed of the interface between the $n^+$ type semiconductor layer 52 and the $p^-$ type semiconductor layer 53 and the interface between the separating portion 60 and the $p^-$ type semiconductor layer 53, the high-concentration impurity region projects, without existence of a region including a high electric field. Therefore, the semiconductor light detecting element 1C has no ends (edges) of the pn junctions where edge breakdown can occur in the Geiger-mode operation. For this reason, there is no need for providing the pn junction of each light detecting channel CH with a guard ring in the semiconductor light detecting element 1C. This permits the semiconductor light detecting element 1C to have a considerably high aperture rate.

As the aperture rate is made higher, the semiconductor light detecting element 1C can have higher detection efficiency. Since the light detecting channels CH are separated by the separating portion 60, it becomes feasible to suitably suppress crosstalk.

The separating portion 60 is formed between the light detecting channels CH. For this reason, when the element is operated in the Geiger mode, even if a voltage difference becomes large between light detecting channels with incidence of photon and channels without incidence, the channels can be fully separated.

In the semiconductor light detecting element 1C, the readout portions 43a of the signal conductor lines 43 are formed above the separating portion 60. For this reason, the signal conductor lines 43 are prevented from crossing above the multiplication regions AM, i.e., from crossing above the light detection surfaces, which further increases the aperture rate. Furthermore, it is also believed to be effective to suppression of dark current. Since in the semiconductor light detecting element 1C the resistors 44 are also formed above the separating portion 60, the aperture rate is further improved thereby.

The inventor discovered that the problem below arises from wavelength dependence of after pulse. When an n-type semiconductor substrate is used and a p-type epitaxial semiconductor layer is formed thereon, some of holes generated in the n-type semiconductor substrate have a delay in entering the multiplication region to cause an after pulse. In view of this problem, the substrate member S is removed from the region where the light detecting channels CH are formed, in the semiconductor light detecting element 1C, whereby the after pulse can be suppressed.

Figure 15:
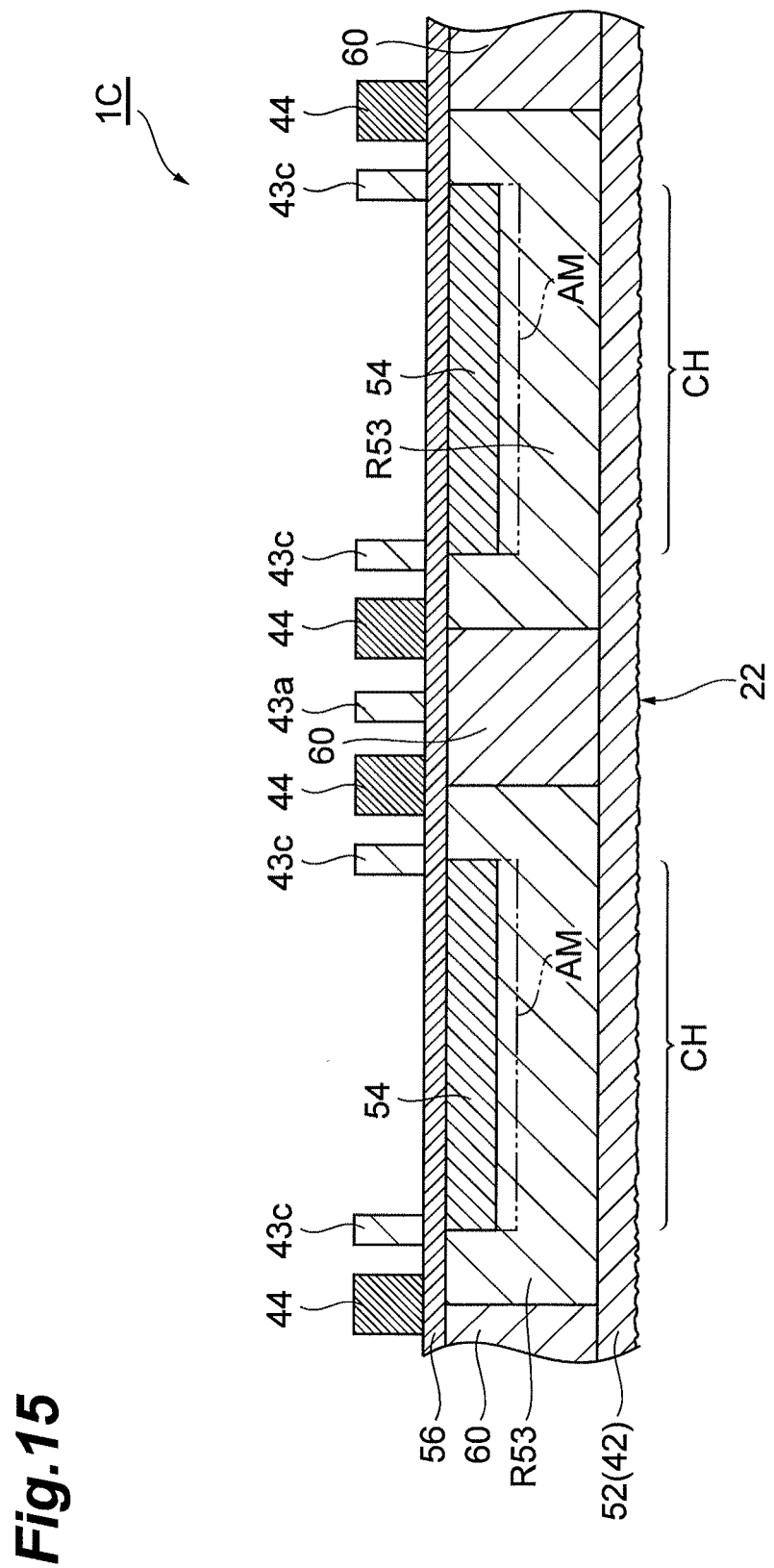
FIG. 15 is a drawing schematically illustrating a cross-sectional configuration of a semiconductor light detecting element according to a modification example of layer structure of the embodiment shown in FIG. 13.

The below will describe a configuration of a modification example of the semiconductor light detecting element 1C of the third embodiment, with reference to FIG. 15. FIG. 15 is a drawing schematically showing a cross-sectional configuration of a photodiode array according to the modification example of the layer structure of the embodiment shown in FIG. 13. The fundamental planar configuration and connection relation in the modification example are the same as those shown in FIG. 12.

As described above, the structure shown in FIG. 15 uses an n-type semiconductor layer R53, in place of the p-type semiconductor layer 53 in FIG. 13. In this case, the pn junctions are formed at interfaces between the low-concentration n-type semiconductor layer R53 and the p-type semiconductor regions 54, depletion layers spread from the pn junctions toward the n-type semiconductor layer R53, and the multiplication regions AM are formed corresponding to the depletion layers from the pn junction interfaces toward the n-type semiconductor layer R53. The other structure and action are the same as those described above.

The semiconductor light detecting element 1C of the modification example is one in which a plurality of light detecting channels CH to which the light to be detected is made incident are formed in the n-type substrate 42 having the n-type semiconductor layer 52. The semiconductor light detecting element 1C is a photodiode array in which the plurality of light detecting channels CH to which the light to be detected is made incident are formed on the substrate with the semiconductor layer 52(S) of the first conductivity type of $n^+$ type. The semiconductor light detecting element 1C is provided with the substrate 42, epitaxial semiconductor layer R53, semiconductor regions 54, and resistors 44. The epitaxial semiconductor layer R53 is formed on the first conductivity type semiconductor layer 52 of the substrate 42 and has the first conductivity type of n type. The epitaxial semiconductor layer R53 has a plurality of multiplication regions AM to achieve avalanche multiplication of carriers generated with incidence of the light to be detected, so that the multiplication regions AM correspond to the respective light detecting channels. The semiconductor regions 54 are formed in the first conductivity type epitaxial semiconductor layer R53 and have the second conductivity type of p$^+$ type. The semiconductor regions 54 make pn junctions at their interfaces to the epitaxial semiconductor layer R53. Each resistor 44 has two end portions and the resistors 44 are provided corresponding to the respective light detecting channels CH. Each resistor 44 is electrically connected through one end portion 44a to the second conductivity type semiconductor region 54 in the epitaxial semiconductor layer R53 and connected through the other end portion 44b to the signal conductor line 43.

The resistors 44, as shown in FIG. 12, are provided for the respective light detecting channels CH through one end portion 44a and channel peripheral portion 43c and connected through the other end portion 44b and connection portion 43b to the readout portion 43a. A plurality of resistors 44 to be connected to an identical readout portion 43a are connected to the readout portion 43a.

In the semiconductor light detecting element 1C of the modification example, the pn junctions are constituted by the first conductivity type epitaxial semiconductor layer R53 on the substrate and the second conductivity type semiconductor regions 54 formed in the epitaxial semiconductor layer R53. The multiplication regions AM are formed in the epitaxial semiconductor layer R53 where the pn junctions are realized, and the multiplication regions AM corresponding to the respective light detecting channels are present in this epitaxial semiconductor layer R53.

The above described the preferred embodiments of the present invention, but it should be noted that the present invention is by no means limited to the above-described embodiments and can be modified in many ways without departing from the spirit and scope of the invention.

The conductivity types of p-type and n-type in the semiconductor light detecting elements 1A-1C of the embodiments may be interchanged so as to be opposite to those described above.

The shape of the photogate electrode PG is not limited solely to the rectangular shape but may be the looped shape described in Japanese Patent Application Laid-open No. 2009-276243.

An optically transparent film thinner than the height difference of the asperity may be formed in the thickness of $\lambda/(4n)$ on the surface where the irregular asperity 22 is formed. This optically transparent film functions, for example, as an antireflection film to visible light. "n" represents the refractive index of the optically transparent film.

Industrial Applicability

The present invention can be applied to the semiconductor light detecting elements such as range image sensors, solid-state imaging devices, or avalanche photodiode arrays.

List of Reference Signs 1A-1C . . . semiconductor light detecting elements; 2 . . . semiconductor substrate; 2BK . . . light incident surface; 2FT . . . front surface; 3 . . . semiconductor substrate; 3BK . . . back surface; 3FT . . . light incident surface; 20 . . . epitaxial semiconductor layer; 21 . . . semiconductor layer; 22 . . . irregular asperity; 30 . . . epitaxial semiconductor layer; 31 . . . semiconductor layer; 33 . . . first semiconductor region; 34 . . . second semiconductor region; 35 . . . third semiconductor region; 36 . . . insulating film; 37 . . . gate electrode; 42 . . . substrate; 52 . . . n$^+$ type semiconductor layer; 53 . . . p$^-$ type semiconductor layer; 54 . . . p$^+$ type semiconductor region; AM . . . multiplication regions; FD1 . . . first semiconductor region; FD2 . . . second semiconductor region; PD . . . photodiode; PG . . . photogate electrode; R53 . . . epitaxial semiconductor layer; $T_1$ . . . amplification transistor; $T_2$ . . . transfer transistor; $T_3$ . . . discharge transistor; $T_4$ . . . selection transistor; TX1 . . . first gate electrode; TX2 . . . second gate electrode.

The invention claimed is:

1. A semiconductor light detecting element comprising:
a silicon substrate having a semiconductor layer having a first impurity concentration, and an epitaxial semiconductor layer grown on the semiconductor layer and having a second impurity concentration lower than the first impurity concentration; and
a conductor provided on a surface of the epitaxial semiconductor layer,
wherein a photosensitive region is formed in the epitaxial semiconductor layer,
wherein irregular asperity is formed at least in a surface opposed to the photosensitive region in the semiconductor layer,
wherein the irregular asperity is optically exposed,
wherein the irregular asperity is formed by applying pulsed laser light,
light incident into the silicon substrate is scattered, diffused, or reflected by the irregular asperity to travel in the silicon substrate, and
the photosensitive region is configured to generate an electric charge in response to incident light.

2. The semiconductor light detecting element according to claim 1,
wherein the conductor comprises a photogate electrode provided on the surface of the epitaxial semiconductor layer, and first and second gate electrodes provided adjacent to the photogate electrode on the surface of the epitaxial semiconductor layer,
the semiconductor light detecting element further comprising:
first and second semiconductor regions formed in the epitaxial semiconductor layer, for reading out respective charges flowing from a region immediately below the photogate electrode to immediately below the first and second gate electrodes,
wherein the irregular asperity is formed at least in a surface opposed to the region immediately below the photogate electrode in the semiconductor layer.

3. The semiconductor light detecting element according to claim 1,
wherein a photodiode to generate charge in a quantity according to an intensity of incident light is formed as the photosensitive region in the epitaxial semiconductor layer, and
wherein the irregular asperity is formed at least in a surface opposed to the photodiode in the semiconductor layer.

4. The semiconductor light detecting element according to claim 3, further comprising:
an amplification transistor to output a voltage value according to a quantity of charge input at a gate terminal thereof;
a transfer transistor to transfer the charge generated in the photodiode, to the gate terminal of the amplification transistor;
a discharge transistor to discharge the charge at the gate terminal of the amplification transistor; and
a selection transistor to selectively output the voltage value output from the amplification transistor.

5. The semiconductor light detecting element according to claim 1,
wherein the epitaxial semiconductor layer has a plurality of multiplication regions forming pn junctions at interfaces to the semiconductor layer and configured to achieve avalanche multiplication of carriers generated with incidence of light to be detected,
wherein the conductor includes a plurality of resistors each having two end portions, provided for the respective multiplication regions, electrically connected to the epitaxial semiconductor layer through one of the end portions, and connected to a signal conductor line through the other of the end portions, and
wherein the irregular asperity is formed at least in a surface opposed to each of the multiplication regions in the semiconductor layer.

6. The semiconductor light detecting element according to claim 1,
wherein the epitaxial semiconductor layer has a plurality of multiplication regions to achieve avalanche multiplication of carriers generated with incidence of light,
wherein semiconductor regions forming pn junctions at interfaces to the epitaxial semiconductor layer are formed corresponding to the multiplication regions in the epitaxial semiconductor layer,
wherein the conductor includes a plurality of resistors each having two end portions, provided for the respective semiconductor regions in the epitaxial semiconductor layer, electrically connected to the respective semiconductor regions in the epitaxial semiconductor layer through one of the end portions, and connected to a signal conductor line through the other of the end portions, and
wherein the irregular asperity is formed at least in a surface opposed to each of the semiconductor regions in the semiconductor layer.

\* \* \* \* \*